(12) United States Patent
Kümmel et al.

(10) Patent No.: US 12,195,838 B2
(45) Date of Patent: Jan. 14, 2025

(54) VACUUM-COATING SYSTEM AND METHOD FOR COATING A BAND-TYPE MATERIAL

(71) Applicant: SMS group GMBH, Düsseldorf (DE)

(72) Inventors: Lutz Kümmel, Jüchen (DE); Thomas Daube, Duisburg (DE)

(73) Assignee: SMS group GMBH, Düsseldorf (DE)

( * ) Notice: Subject to any disclaimer, the term of this patent is extended or adjusted under 35 U.S.C. 154(b) by 406 days.

(21) Appl. No.: 17/059,351

(22) PCT Filed: Apr. 18, 2019

(86) PCT No.: PCT/EP2019/060156
§ 371 (c)(1),
(2) Date: Nov. 27, 2020

(87) PCT Pub. No.: WO2019/228709
PCT Pub. Date: Dec. 5, 2019

(65) Prior Publication Data
US 2021/0238726 A1    Aug. 5, 2021

(30) Foreign Application Priority Data

May 28, 2018 (DE) .................. 10 2018 208 339.8
Sep. 5, 2018 (DE) .................. 10 2018 215 102.4

(51) Int. Cl.
*C23C 14/02* (2006.01)
*B65H 23/02* (2006.01)
(Continued)

(52) U.S. Cl.
CPC ....... *C23C 14/028* (2013.01); *B65H 23/0204* (2013.01); *B65H 23/032* (2013.01); *C23C 14/16* (2013.01); *C23C 14/562* (2013.01); *B65H 2301/5114* (2013.01); *B65H 2406/31* (2013.01); *B65H 2701/173* (2013.01)

(58) Field of Classification Search
CPC ..... C23C 14/562; C23C 14/50; C23C 14/568; C23C 14/028; C23C 14/16; B65H 23/032; B65H 23/0204
See application file for complete search history.

(56) References Cited

U.S. PATENT DOCUMENTS 3,615,309 A * 10/1971 Dawson ................. B23D 65/00
                                                                51/293
4,842,893 A *  6/1989 Yializis ................. B05D 3/068
                                                              427/255.6
(Continued)

FOREIGN PATENT DOCUMENTS

CN      105177573 A    12/2015
DE      3035000 A1      3/1982
(Continued)

OTHER PUBLICATIONS

Office Action issued on Feb. 27, 2023, in corresponding Korean Application No. 10-2020-7033449, 13 pages.
(Continued)

*Primary Examiner* — Joseph A Miller, Jr.
(74) *Attorney, Agent, or Firm* — Maier & Maier, PLLC

(57) ABSTRACT

The invention relates to a method and a vacuum-coating system (10) for coating a band-type material (11), in particular made of metal. For this, the band-type material (11) is moved, via a conveying section (12), in a transport direction (T) and is vacuum-coated within a coating chamber (14), in which a vacuum is applied. As seen in the transport direction (T) of the band-type material (11), at least one flatness optimization device (39) is arranged upstream of the coating chamber (14), through which flatness optimization device the band-type material (11) can be guided. In this way, a desired flatness is generated for the band-type material (11).

7 Claims, 2 Drawing Sheets

Figure 1:
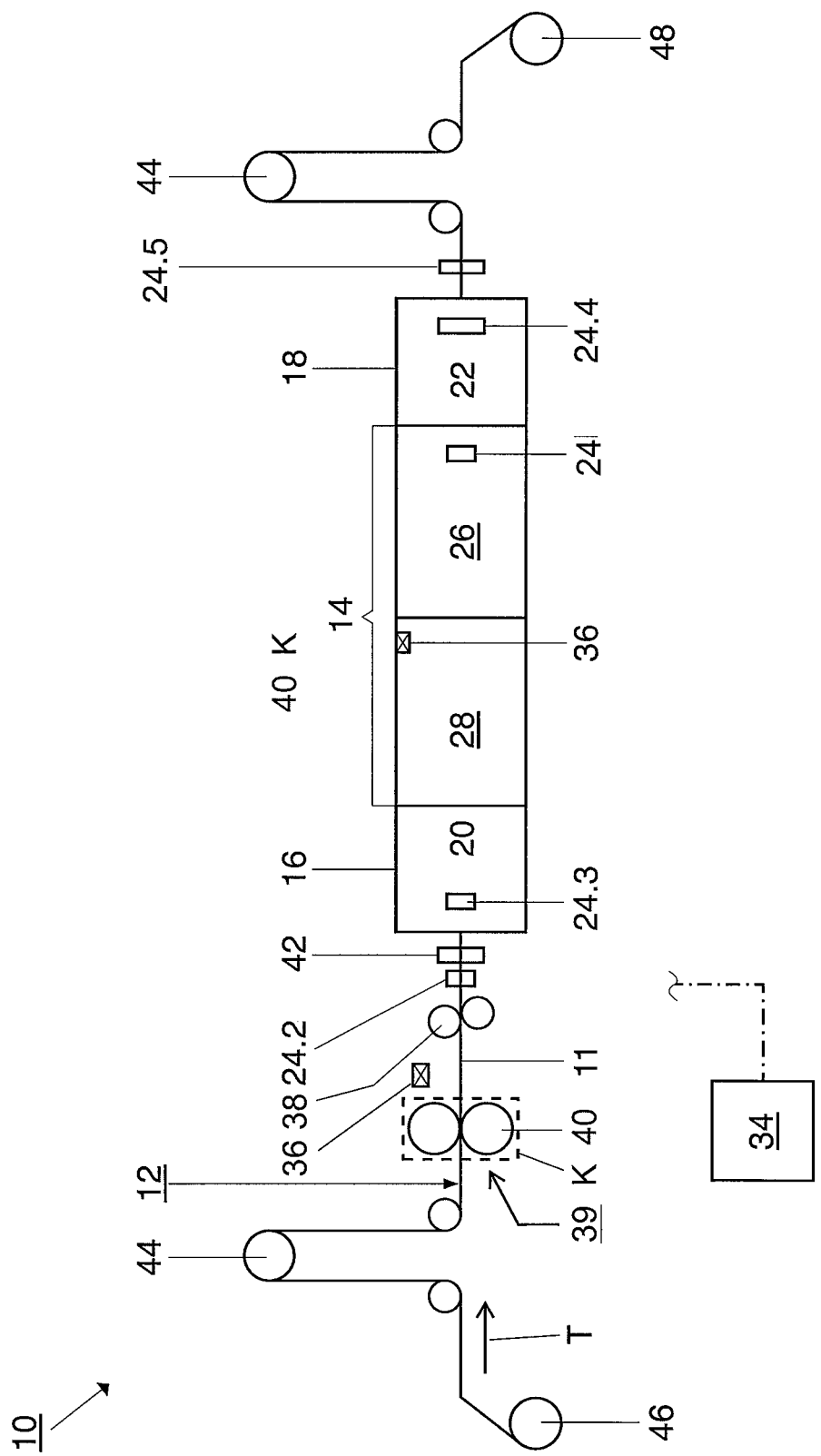

(51) Int. Cl.
  *B65H 23/032* (2006.01)
  *C23C 14/16* (2006.01)
  *C23C 14/56* (2006.01)

(56) References Cited

U.S. PATENT DOCUMENTS

| | | | | |
|---|---|---|---|---|
| 6,113,753 | A * | 9/2000 | Washburn | C23C 14/562 |
| | | | | 451/340 |
| 2002/0020496 | A1* | 2/2002 | Shinohara | C23C 14/562 |
| | | | | 204/298.25 |
| 2002/0095747 | A1* | 7/2002 | Legoupil | C23C 2/40 |
| | | | | 24/21 |
| 2003/0145914 | A1 | 8/2003 | Brisberger et al. | |
| 2003/0221618 | A1 | 12/2003 | Kashiwaya et al. | |
| 2004/0026234 | A1* | 2/2004 | Vanden Brande | H01J 37/3408 |
| | | | | 204/192.12 |
| 2004/0159285 | A1* | 8/2004 | Doehler | F16J 15/3452 |
| | | | | 118/718 |
| 2004/0253377 | A1* | 12/2004 | Bok | C23C 16/545 |
| | | | | 427/249.2 |
| 2011/0189806 | A1* | 8/2011 | Cao | C23C 16/24 |
| | | | | 257/E31.11 |
| 2016/0340776 | A1 | 11/2016 | Sauer et al. | |

FOREIGN PATENT DOCUMENTS

| | | |
|---|---|---|
| DE | 19527515 C1 | 11/1996 |
| DE | 19735603 C1 | 11/1998 |
| DE | 102009053367 A1 | 5/2011 |
| DE | 102012108231 A1 | 12/2013 |
| DE | 102016223743 A1 | 11/2017 |
| EP | 0863222 A1 | 9/1998 |
| JP | S62118905 A | 5/1987 |
| JP | 2003526737 A | 9/2003 |
| JP | 2004174568 A | 6/2004 |
| JP | 2008031505 A | 2/2008 |
| WO | WO-2012034587 A1 * 3/2012 ............ B05D 3/068 |
| WO | 2014/090561 A1 | 6/2014 |

OTHER PUBLICATIONS

Search Report dated Jun. 17, 2022, in corresponding Chinese Application No. 2019800359208, 3 pages.
First Office Action dated Jul. 5, 2022, in corresponding Chinese Application No. 2019800359208, 14 pages (with English Translation).
Office Action issued on Oct. 24, 2022, in corresponding Korean Application No. 1020207033449, 11 pages.
International Search Report and Written Opinion issued on Sep. 4, 2019 in corresponding International application No. PCT/EP2019/060156; 17 pgs.
International Preliminary Report and Written Opinion issued on Sep. 25, 2020 in corresponding International application No. PCT/EP2019/060156; 53 pgs.
Office Action issued on Apr. 8, 2022, in connection with corresponding Korean Application No. 10-2020-7033449 (13 pp., including machine-generated English translation).

* cited by examiner

VACUUM-COATING SYSTEM AND METHOD FOR COATING A BAND-TYPE MATERIAL

The invention relates to a vacuum-coating system according to the preamble of claim 1, and a method for coating a band-type material.

During the production of steel bands, there are width changes in the band over the length during both hot rolling and cold rolling. This is caused by so-called "expansion" which results in an increase of a few millimeters in the width of the rolled band due to the rolling pass. The differing expansion over the length of the steel band is normally due to fluctuations in tension within the system with which the steel strip is being processed.

A further problem when rolling steel bands is that waves on the edge or in the center may result from the rolling process due to the different lengthening over the cross-section.

During the production of band-type material, e.g. in the form of steel bands, it is known according to the prior art to galvanize the surfaces of this band-type material. This can take place by means of a vacuum vapor deposition process as is known, for example, from DE 30 35 000 A1, DE 195 27 515 C1, or DE 197 35 603 C1. This vacuum vapor deposition process also includes so-called PVD technology, which is explained, for example, in DE 10 2009 053 367 A1.

In the aforementioned vacuum vapor deposition process, the coating of the band-type material takes place in a vacuum, wherein the band-type material is supplied to a chamber or the like, in which a vacuum exists or is generated, by means of a lock and/or a system of diaphragm elements. The sealing of the vacuum generated in the chamber relative to the environment is usually via sealant in the form of diaphragm elements, which is described, for example, in WO 2008/049523 A1 in connection with a band lock. According to EP 1 004 369 B1, such a seal can also be realized by a lock with a plurality of rollers, wherein at least one roller is arranged offset with respect to at least two other rollers and can be adjusted in its distance to these two other rollers to provide a seal for the band-type material, which is moved between these rollers.

If a band-type material is coated according to the principle of the vacuum vapor deposition process, the sealing of the vacuum against the environment is of great importance. For this purpose, the vacuum chamber, in which the coating of the band-type material is implemented, has locks on the inlet side and outlet side. If the band-type material has flatness defects over its band length, which may arise due to upstream heat treatment processes, this can either lead to increased wear or even to a break in the vacuum in the region of the locks of the vacuum chamber, whereby the coating process under vacuum is disturbed. In addition, such flatness defects within the vacuum chamber result in changed distances between the surfaces of the band-type material to be coated and the coating and cleaning modules, whereby the vacuum-coating process is also impacted.

Accordingly, the object upon which the invention is based is to optimize the coating of band-type material under vacuum with simple means and to achieve improved process reliability for this.

This object is achieved by means of a vacuum-coating system and by means of a method for coating a band-type material.

A vacuum-coating system according to the present invention is used for coating a band-type material, in particular of metal, and comprises a conveying section with transport means, in particular in the form of rollers on which the band-type material can be moved in a transport direction; a coating chamber in which vacuum can be generated, wherein the coating chamber has an inlet region and an outlet region and can thereby be traversed by the band-type material along or on the conveying section in the transport direction. As seen in the transport direction of the band-type material, at least one flatness optimization device is arranged upstream of the coating chamber, through which flatness optimization device the band-type material can be guided in order to create a desired flatness.

In the same manner, the invention also provides for a method for coating a band-type material, particularly made of metal, in which the band-type material is moved in a transport direction via a conveying section and is vacuum-coated within a coating chamber, in which a vacuum is applied. In this case, the band-type material is optimized upstream—as seen in the transport direction—of the coating chamber as relates to its flatness by means of a flatness optimization device. This takes place by means of the flatness optimization device which may have a skin pass mill device, a bend-straightening device (e.g. in the form of a multi-roller straightening machine), a stretch leveler, and/or a stretching/bend-straightening device.

The invention is based on the essential knowledge that a band-type material is optimized as relates to its flatness before it enters the coating chamber, under vacuum, of a vacuum-coating system. For this purpose, the band-type material passes through the flatness optimization device in a region which is upstream of the coating chamber of the vacuum-coating system—as seen in the transport direction of the band-type material—such that a desired flatness is thus set on the surfaces of the band-type material, and any potential flatness defects are eliminated in any case. As a result of this, the band-type material subsequently enters the coating chamber under vacuum with a flatness optimized on its surfaces. The optimized flatness on the surfaces of the band-type material also has an advantageous effect with respect to the necessary sealing of the vacuum when the inlet region and the outlet region of the coating chamber are being traversed.

With respect to the flatness optimization device, it should particularly be mentioned at this juncture that it may have, according to the invention, a bend-straightening device, e.g. in the form of a multi-roller straightening machine, a stretch leveler, a stretching/bend-straightening device, and/or a skin pass mill device in combination with these two devices.

In an advantageous refinement of the invention, it may be provided that not only the necessary flatness but also a predetermined roughness is set on the surfaces of the band-type material by means of the flatness optimization device. To this end, particularly a skin pass mill device is suitable which may be a component of the flatness optimization device.

In an advantageous refinement of the invention, a band lengthening is achieved for the band-type material, i.e. a lengthening of the band in its longitudinal extension, in a range of from 0.15% to 12%, by means of the flatness optimization device. To this end, particularly the use of a stretching/bend-straightening device is suitable which may be a component of the flatness optimization device. As a result, a fine adjustment of the thickness tolerances is achieved for the band-type material by means of such a band lengthening, which is advantageous, particularly when machining hot bands.

In addition to the aforementioned 0.15%, possible lower limits for such a band lengthening may also include the following values: 0.2%, 0.25%, 0.3%, 0.35%, 0.4%, 0.45%, 0.5%, 0.55%, 0.6%, 0.65%, 0.7%, 0.75%, 0.8%, 0.85%, 0.9%, 0.95%, 1.0%, 1.05%, 1.1%, 1, 15%, 1, 2%, 1.25%, 1.3%, 1.35%, 1.4%, 1.45%, 1.5%, 1.65%, 1.7%, 1.75%, 1.8%, 1.85%, 1.9%, 2.0%, 2.05%, 2.1%, 2.15%, 2.2%, 2.25%, 2.3%, 2.35%, 2.4%, 2.45%, 2.5%, 2.55%, 2.6%, 2.65%, 2.7%, 2.75%, 2.8%, 2.85%, 2.9%, 2.95%, 3.0%, 3.05%, etc. Further lower limits of up to 11% are possible, wherein intermediate values of 0.05% each are possible, as has just been mentioned up to the limit of 3.05% by means of an example.

In addition to the aforementioned 12%, possible upper limits for such a band lengthening may also include the following values: 11.95%, 11.9%, 11.85%, 11.8%, 11.75%, 11.7%, 11.65%, 11.6%, 11.55%, 11.5%, 11.45%, 11.4%, 11.35%, 11.3%, 11.25%, 11.2%, 11.15%, 11.1%, 11.05%, 11.0%, 10.95%, 10.9%, 10.85%, 10.8%, 10.75%, 10.7%, 10.65%, 10.6%, 10.55%, 10.5%, 10.45%, 10.4%, 10.35%, 10.3%, 10.25%, 10.2%, 10.15%, 10.1%, 10.05%, 10.0%, 9.95%, 9.9%, 9.85%, 9.8%, 9.75%, 9.7%, 9.65%, 9.6%, 9.55%, 9.5%, 9.45%, 9.4%, 9.35%, 9.3%, 9.25%, 9.2%, 9.15%, 9.1%, 9.0%, 8.95%, etc. Further lower limits of up to 1% are possible, wherein intermediate values of 0.05% each are possible, as has just been mentioned up to the limit of 8.95% by means of an example.

The present invention advantageously enables a coating, under vacuum, of band-type material which consists of steel band and has a structural proportion of at least 10% martensite. Such a steel band may further contain 0.1-0.4% carbon, 0.5-2.0% silicon, and/or 1.5-3.0% manganese. Such steels may be present as dual-phase steels (DP), complex-phase steel (CP), quenching and partitioning steels (Q&P), or as martensitic steels (MS), each of which having a different content of martensites (with at least 10%).

Figure 2:
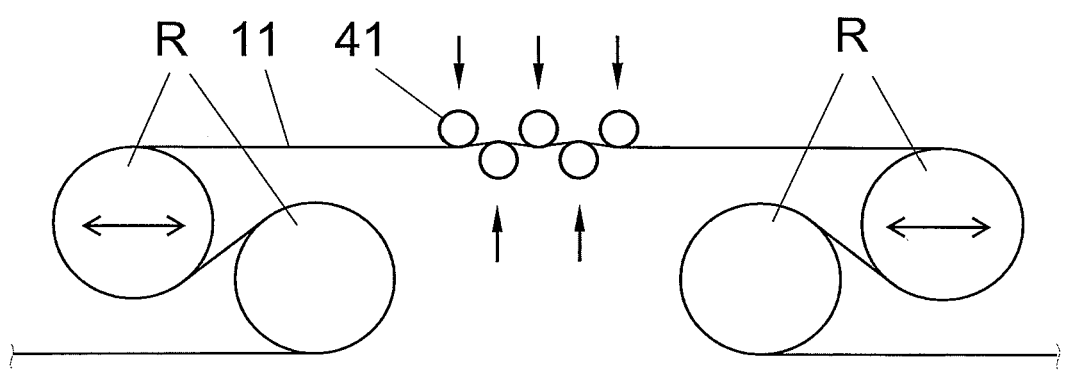

A preferred embodiment of the invention is described in the following in detail by means of schematically simplified drawings. The following is shown:

FIG. 1 a schematically simplified side view of a vacuum-coating system according to the invention, with which a method according to the present invention can also be implemented; and FIG. 2 a schematically simplified side view of a stretching/bend-straightening device, which is part of the vacuum-coating system from FIG. 1.

The present invention provides for a vacuum-coating system 10, with which a band-type material 11 can be provided with a coating on at least one side thereof, preferably on both sides (upper side and lower side). Accordingly, a method particularly for coating the band-type material 11 can also be implemented with such a vacuum-coating system 10. Equivalent features in the two figures of the drawing are each provided with the same reference numbers. At this juncture, particular reference is made to the fact that the drawing is merely simplified and particularly not shown to scale.

The band-type material 11 may consist of metal, particularly of steel or stainless steel, or corresponding alloys thereof. Furthermore, reference is made to the fact that the band-type material 11, which is coated with the vacuum-coating system 10, may be a hot band or cold band.

The vacuum-coating system 10, the individual components thereof, and the functional principle thereof are explained in detail in the following:

The vacuum-coating system 10 comprises a conveying section 12 with (not shown) transport means, e.g. in the form of rollers, on which the band-type material is moved in a transport direction T. In this case, the band-type material 11 is unwound by a first winding device 46 at the infeed of the conveying section 12, wherein the band-type material 11—after implementation and/or completion of the desired coating—is wound up again by a second winding device 48 at the outfeed of the conveying section 12. (Band) storage units 44, with or in which the band-type material 11 can be stored, can be provided directly downstream of the first winding device 46 and upstream of the second winding device 48. The band-type material 11 is moved and/or transported within the conveying section 12 in the direction of movement T, namely from the first winding device 46 in the direction of the second winding device 48.

A coating chamber 14, through which the band-type material 11 is moved, is arranged along the conveying section 12. To this end, the coating chamber 14 has an inlet region 16 and an outlet region 18, wherein an entry lock 20 is provided in the inlet region 16 and an exit lock 22 is provided in the outlet region 18. A vacuum is generated in the coating chamber 14. In this case, the entry lock 20 and the exit lock 22 ensure suitable sealing of this vacuum to the external environment upon the simultaneous movement of the band-type material 11 along the conveying section 12 and/or through these two locks 20, 22.

The coating chamber 14 is formed in multiple parts and has a coating part 26 and a cleaning part 28. As previously explained, both of these parts, 26 and 28, are placed under vacuum. The actual coating of the band-type material 11 is carried out in the coating part 26, e.g. according to the principle of PVD (=physical vapor deposition), either on one side of the band-type material or on both sides thereof.

At least one band position control device 24 may be arranged within the coating chamber 14, e.g. within the coating part 26, as is shown in FIG. 1. As a supplement or alternative, it is possible to arrange such a band position control device 24 in the cleaning part 28.

The vacuum-coating system 10 comprises a control unit (shown in simplified form in FIG. 1 by a box having the reference numeral "34"), which has a signal connection (wired or wireless, e.g. via a radio link or the like) with at least one position sensor 36. This position sensor 36 may be arranged in the coating chamber 14 for the purpose of determining the position of the band-type material 11 on the conveying section 12, particularly as relates to the center region thereof.

It is possible to adjust and/or align a position of the band-type material 11 as relates to a center of the conveying section 12 by means of the band position control device 24. This is accomplished in that a position of the band-type material 11 on the conveying section 12 is detected by means of the position sensor 36 within the coating chamber 14, wherein subsequently—as needed—actuators (not shown) of the band position control device 24 are actuated by means of the control unit 34 in order to align the band-type material 11 as relates to the center of the conveying section 12 and perpendicular to the transport direction T. Accordingly, the band-type material 11 can always be optimally positioned within the coating chamber 14 under vacuum such that, for example, an impact or contact is prevented between the band-type material 11 and the sidewalls of the coating chamber 14 or of the coating part 26 during a movement of the band-type material 11 along the conveying section 12.

Furthermore, it may be provided that further band position control devices 24.3, 24.4 are arranged within the entry lock 20 and/or within the exit lock 22. It is likewise possible that a further band position control device 24.2 is arranged upstream of the entry lock 20—as seen in the transport direction T of the band-type material 11—and/or that a further band position control device 24.5 is arranged downstream of the exit lock 22—as seen in the transport direction T of the band-type material 11.

As seen in the transport direction T of the band-type material 11, a further chemical cleaning device 42, which is traversed by the band-type material 11 before an infeed into the coating chamber 14, may be arranged upstream of the entry lock 20. The surfaces of the band-type material 11 are hereby cleansed or cleaned in preparation before the material is subjected to precision cleaning in the cleaning part 28 (under a vacuum).

The vacuum-coating system 10 comprises at least one flatness optimization device 39, which has a skin pass mill device 40 and is arranged upstream of the entry lock 20—as seen in the transport direction T of the band-type material 11. The band-type material 11 traverses the skin pass mill device 40 before it subsequently enters the coating chamber 14. The flatness on the surfaces of the band-type material 11 is adjusted to a desired value due to the contact with the rollers of the skin pass mill device 40, wherein potential flatness flaws on the surfaces of the band-type material 11 are simultaneously eliminated.

FIG. 2 shows a simplified side view of a stretching/bend-straightening device 41, which may be a component of the flatness optimization device 39 according to a further embodiment of the invention, as a supplement or alternative to the aforementioned skin pass mill device 40. The designation "K" and the assigned dashed rectangle in FIG. 1 simply indicate that the flatness optimization device 39 can also be formed as a compact unit, which comprises both a skin pass mill device 40 and a stretching/bend-straightening device 41.

By means of the stretching/bend-straightening device 41 and a placement of the rollers thereof, which is indicated in FIG. 2 by corresponding vertical arrows, the flatness of the band-type material 11 is further improved on the surfaces thereof and optionally also a band lengthening is achieved, i.e. a lengthening of the band-type material 11 in the longitudinal direction thereof. To this end, rollers R may be provided adjacent the stretching/bend-straightening device 41, about said rollers the band-type material 11 is guided in a loop, wherein a targeted band tension can be applied to the band-type material 11 by means of these rollers R. To do this, the rollers R, which are each arranged outward, can be moved, e.g., translationally horizontally, which is indicated in FIG. 2 by corresponding horizontal double-headed arrows.

The vacuum-coating system 10 comprises at least one pair of trimming shears 38, upstream of the entry lock 20 of the coating chamber 14—as seen in the transport direction T of the band-type material 11. Adjacent thereto, at least one further position sensor 36 is provided, with which a position of the band-type material 11 on the conveying section 12 can be determined in a region upstream of the coating chamber 14 and thus also in the region of the trimming shears 38. This position sensor 36 is also connected to the control unit 34 with signals. Accordingly, it is possible by means of the control unit 34 to actuate the trimming shears 38 or place them into action as a function of signals of the position sensor 36.

The signaling connection between the control unit 34, on the one hand, and the position sensors 36, the band position control device 24, and the trimming shears 38, on the other hand, is simply indicated in FIG. 1 by a dotted-dashed line.

The trimming shears 38 are used to trim the band-type material 11 either at a band edge thereof or optionally on both band edges (i.e. on the left and right side edge of the band-type material 11), i.e. to make narrower through cutting and thereby to reduce the width of the band-type material 11 perpendicular to the transport direction T. The trimming shears 38 are then actuated, during operation of the vacuum-coating system 10 and upon a corresponding movement of the band-type material 11 along the conveying section 12, when it is detected by the position sensor 36 that a width of the band-type material 11 deviates from a predetermined setpoint and, for example, a widening is consequently too large. The trimming makes it possible for the band-type material 11 to obtain a uniform width over its length in the region upstream of the entry lock 20 and thus upstream of the infeed into the coating chamber 14, wherein said width is also optimally adapted to the width of the entry lock 20.

A coating is applied, e.g. a zinc layer, to at least one surface of the band-type material 11, preferably to both surfaces thereof, by moving the band-type material 11 through the coating chamber 14. This coating can take place within the coating part 26 according to the PVD principle. Once at least one surface of the band-type material 11 has been provided with a coating, e.g. with a zinc layer, the band-type material 11 is then wound back up again, as explained, by the second winding device 12.

Thus, the present invention provides for the application of a coating to a or the surface(s) of the band-type material 11 only at low temperatures without the material properties of the band-type material 11 being changed or impacted. This is particularly advantageous when the band-type material is a steel band, particularly in the form of a hot band, which has a structural proportion of at least 10% martensite.

LIST OF REFERENCE NUMERALS

10 Vacuum-coating system
11 Band-type material
12 Conveying section
14 Coating chamber
16 Inlet region
18 Outlet region
20 Entry lock
22 Exit lock
24 Band position control device
24.2 Band position control device
24.3 Band position control device
24.4 Band position control device
26 Coating part
28 Cleaning part
34 Control unit
36 Position sensor
38 Trimming shears
39 Flatness optimization device
40 Skin pass mill device
41 Stretching/bend-straightening device
42 Chemical cleaning device
44 Storage unit
46 First winding device (infeed)
48 Second winding device (outfeed)
K Compact unit
   (=skin pass mill device 40+stretching/bend-straightening device 41)
R Rollers (for creating the band tension)
T Transport direction (for the band-type material 11)

The invention claimed is:
1. A vacuum-coating system for coating a metallic band-type material, the vacuum-coating system comprising:

a conveying section with rollers that are configured to move the metallic band-type material in a transport direction, a coating chamber that is configured to generate the vacuum, wherein the coating chamber has:

an inlet region with an entry lock;

a coating part, placed under the vacuum, that is configured to coat the metallic band-type material;

a cleaning part placed under the vacuum, wherein at least one band position control device is arranged within either the coating part or the cleaning part; and an outlet region with an exit lock, and thereby is traversed by the metallic band-type material along or on the conveying section in the transport direction, at least one flatness optimization device is coupled by the entry lock to the coating chamber through which the at least one flatness optimization device the metallic band-type material is guided, in order to create a desired flatness.

2. The vacuum-coating system according to claim 1, wherein the flatness optimization device has a skin pass mill device.

3. The vacuum-coating system according to claim 1, wherein the flatness optimization device is formed in the form of a bend-straightening device.

4. The vacuum-coating system according to claim 3, wherein the bend-straightening device is a multi-roller straightening machine.

5. The vacuum-coating system according to claim 1, wherein the flatness optimization device is formed in the form of a stretch leveler.

6. The vacuum-coating system according to claim 1, wherein the flatness optimization device is formed in the form of a compact unit, in which a bend-straightening device and a stretch leveler are combined to form a stretching/bend-straightening device.

7. The vacuum-coating system according to claim 1, wherein the flatness optimization device is formed in the form of a compact unit, which comprises a skin pass mill device, on one side, and a bend-straightening device, a stretch leveler, or a stretching/bend-straightening device, on the other side.

\* \* \* \* \*